United States Patent
Kim

(10) Patent No.: US 10,468,086 B2
(45) Date of Patent: Nov. 5, 2019

(54) MEMORY SYSTEMS AND METHODS OF CONTROLLING REFRESH OPERATIONS OF MEMORY SYSTEMS

(71) Applicant: SK hynix Inc., Icheon-si, Gyeonggi-do (KR)

(72) Inventor: Hyun Seok Kim, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/129,547

(22) Filed: Sep. 12, 2018

(65) Prior Publication Data

US 2019/0130960 A1    May 2, 2019

(30) Foreign Application Priority Data

Oct. 26, 2017    (KR) .................. 10-2017-0140520

(51) Int. Cl.
| | |
|---|---|
| G11C 11/406 | (2006.01) |
| G11C 8/10 | (2006.01) |
| G11C 29/42 | (2006.01) |
| G06F 11/00 | (2006.01) |
| G11C 7/10 | (2006.01) |
| G11C 29/04 | (2006.01) |

(52) U.S. Cl.
CPC ............ *G11C 11/406* (2013.01); *G06F 11/00* (2013.01); *G11C 8/10* (2013.01); *G11C 11/40611* (2013.01); *G11C 29/42* (2013.01); *G11C 7/1006* (2013.01); *G11C 2029/0411* (2013.01); *G11C 2211/4062* (2013.01)

(58) Field of Classification Search
None
See application file for complete search history.

(56) References Cited

U.S. PATENT DOCUMENTS

| | | | |
|---|---|---|---|
| 6,199,139 B1 | 3/2001 | Katayama et al. | |
| 2004/0027882 A1* | 2/2004 | Nakagawa | G11C 11/406 365/200 |
| 2005/0281112 A1* | 12/2005 | Ito | G11C 11/406 365/222 |
| 2011/0055671 A1* | 3/2011 | Kim | G06F 11/1028 714/800 |
| 2018/0374546 A1* | 12/2018 | Shi | G11C 16/3418 |

FOREIGN PATENT DOCUMENTS

| | | |
|---|---|---|
| KR | 101203764 B1 | 11/2012 |
| KR | 1020130046230 A | 5/2013 |

* cited by examiner

*Primary Examiner* — Douglas King
(74) *Attorney, Agent, or Firm* — William Park & Associates Ltd.

(57) ABSTRACT

A memory system is provided. The memory system includes a memory device and a memory controller. The memory device includes a plurality of memory dies and a refresh controller, and the refresh controller includes a refresh skip control block. The memory controller transmits a refresh skip period signal of each of the memory dies to the refresh skip control block according to a result of an error correction code (ECC) decoding operation performed on each of the memory dies so that the memory dies have independent refresh skip periods.

18 Claims, 4 Drawing Sheets

MEMORY SYSTEMS AND METHODS OF CONTROLLING REFRESH OPERATIONS OF MEMORY SYSTEMS

CROSS-REFERENCE TO RELATED APPLICATION

The present application claims priority under 35 U.S.C 119(a) to Korean Application No. 10-2017-0140520, filed on Oct. 26, 2017, which is incorporated by reference herein in its entirety.

BACKGROUND

1. Technical Field

Various embodiments of the present disclosure generally relate to memory systems and methods of controlling refresh operations of the memory systems.

2. Related Art

Each of memory systems may include a memory device having a plurality of memory cells and a memory controller for controlling various operations of the memory device. Memory devices may include dynamic random access memory (DRAM) devices, and each of the DRAM devices may include a plurality of DRAM cells. Each of the DRAM cells may be configured having a cell capacitor and a cell transistor. The cell capacitor may be charged or discharged to write a datum into the cell capacitor of the DRAM devices. Once the cell capacitor is charged or discharged to write a datum therein, an amount of electric charge stored in the cell capacitor has to be ideally constant even though time elapses. However, as time elapses, the amount of electric charge stored in the cell capacitor may actually vary because of a voltage difference between the cell capacitor and a circuit adjacent to the cell capacitor, or because of a leakage current of the cell capacitor. If the amount of electric charge stored in the cell capacitor varies, the datum written in the cell capacitor may be lost. Thus, DRAM devices may require a refresh operation to prevent the DRAM cells from losing data. In the case of DRAM devices, the refresh operation may be performed by recharging cell capacitors having data that corresponds to a logic "high" level (or a logic "low" level).

SUMMARY

According to an embodiment, a memory system includes a memory device and a memory controller. The memory device includes a plurality of memory dies and a refresh controller, and the refresh controller includes a refresh skip control block. The memory controller transmits a refresh skip period signal of each of the memory dies to the refresh skip control block according to a result of an error correction code (ECC) decoding operation performed on each of the memory dies so that the memory dies have independent refresh skip periods.

According to another embodiment, there is provided a method of refreshing a memory system including a memory device. The memory device includes a plurality of memory dies and a refresh controller, and the refresh controller includes a refresh skip control block. The method includes reading a read codeword stored in any one memory die selected from the memory dies of the memory device according to a read command, performing an error correction code (ECC) decoding operation on the read codeword, generating read data corresponding to the read codeword decoded by the ECC decoding operation and an error signal, generating a count signal in response to the error signal, transmitting a refresh skip period signal to the memory device if a value of the count signal is greater than a critical value, and changing a refresh skip period of the selected memory die according to the refresh skip period signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under", or "beneath" another element, it is intended to mean a relative positional relationship, but not used to limit certain cases that the element directly contacts the other element, or at least one intervening element is present therebetween. Accordingly, the terms such as "on", "over", "above", "under", "beneath", "below", and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Various embodiments are directed to memory systems and methods of controlling refresh operations of the memory systems.

Figure 1:
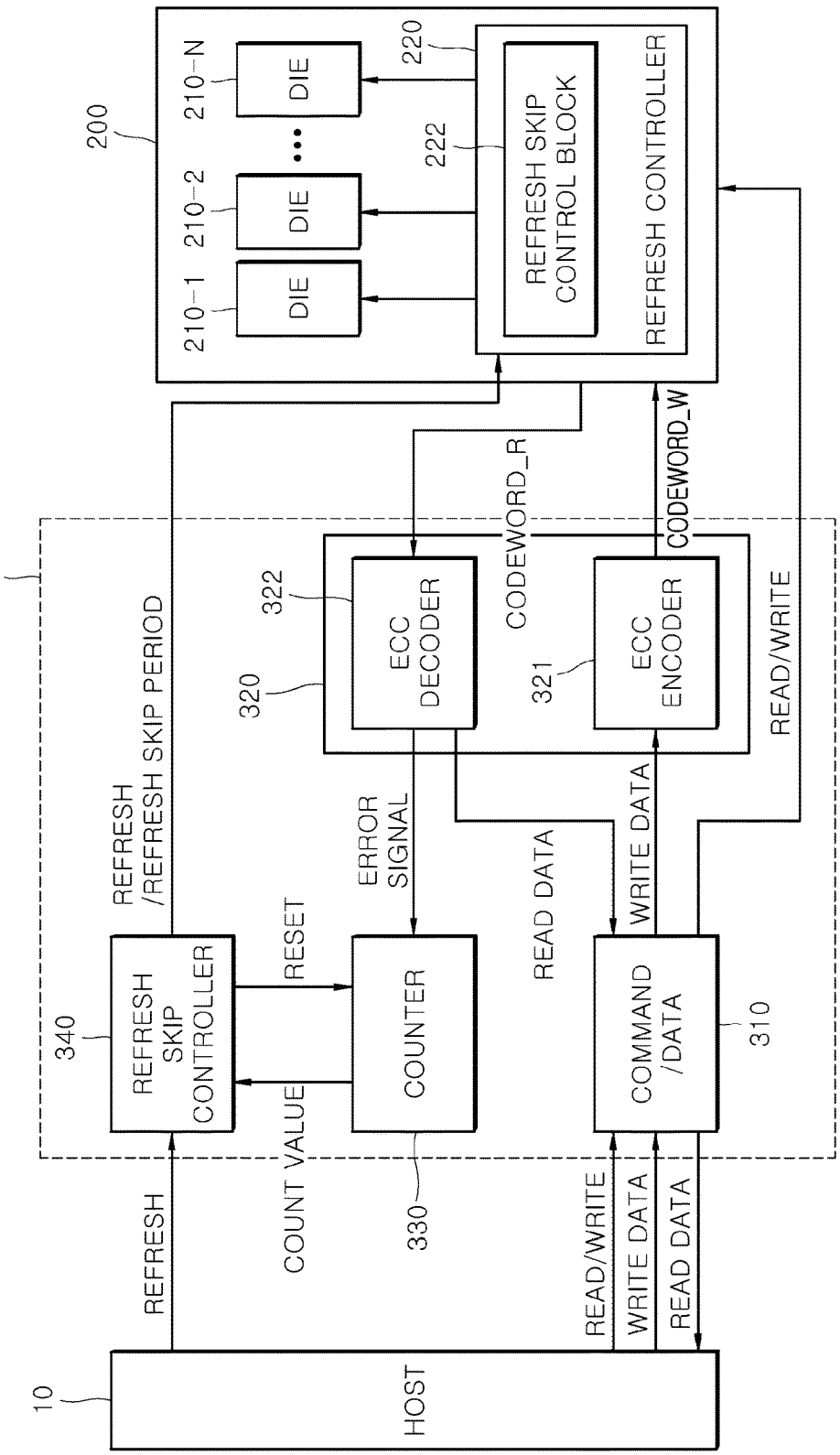
FIG. 1 is a block diagram illustrating a memory system according to an embodiment of the present disclosure.

FIG. 1 is a block diagram illustrating a memory system 100 according to an embodiment of the present disclosure. Referring to FIG. 1, the memory system 100 may be configured to include a memory device 200 and a memory controller 300. In an embodiment, the memory device 200 and the memory controller 300 may constitute a memory module. The memory device 200 may include a plurality of memory dies (e.g., first to $N^{th}$ memory dies 210-1, 210-2, ... and 210-N) and a refresh controller 220. In an embodiment, each of the first to $N^{th}$ memory dies 210-1, 210-2, ... and 210-N may be a volatile memory die. For example, each of the first to $N^{th}$ memory dies 210-1, 210-2, ... and 210-N may be a DRAM die. The first to $N^{th}$ memory dies 210-1, 210-2, ... and 210-N may be provided in a package form. In such a case, the first to $N^{th}$ memory dies 210-1, 210-2, ... and 210-N may be stacked in a single memory package. Alternatively, the memory device 200 may be provided to include a plurality of memory packages, each of which has one of the first to $N^{th}$ memory dies 210-1, 210-2, . . . and 210-N.

The refresh controller 220 may include a refresh skip control block 222. The refresh controller 220 may control refresh operations performed on the first to $N^{th}$ memory dies 210-1, 210-2, . . . and 210-N in response to a refresh command. The refresh skip control block 222 may set a refresh skip cycle time so that the refresh operation is skipped, where the refresh operation may be performed by the refresh controller 220. The refresh controller 220 may control the refresh operation over the refresh skip cycle time which is set by the refresh skip control block 222.

The memory controller 300 may be configured to include a command/data processor 310, an error correction code (ECC) controller 320, a counter 330 and a refresh skip controller 340. The command/data processor 310 may process read data READ_DATA or write data WRITE_DATA in response to a read/write command READ/WRITE outputted from a host 10. Although not illustrated in FIG. 1, the read/write command READ/WRITE may include information, for example, an address which is necessary for performing a read/write operation on the memory device 200. If a read command READ outputted from the host 10 is applied to the memory controller 300, the command/data processor 310 may transmit the read command READ to the memory device 200 and may transmit the read data READ_DATA to the host 10, where the read data READ_DATA is generated by the ECC controller 320 for performing an ECC decoding operation on decoding data (provided in a codeword form) outputted from the memory device 200. If a write command WRITE outputted from the host 10 is applied to the memory controller 300, the command/data processor 310 may transmit the write command WRITE to the memory device 200 and may transmit the write data WRITE_DATA to the ECC controller 320, where the write data WRITE_DATA is outputted from the host 10.

The ECC controller 320 may be configured to include an ECC encoder 321 and an ECC decoder 322. The ECC encoder 321 may perform an ECC encoding operation on data (i.e., the write data WRITE_DATA) to be written into the memory device 200. The ECC decoder 322 may perform an ECC decoding operation on data (provided in a codeword form), which is read out of the memory device 200. If the write command is outputted from the host 10 and the write data WRITE_DATA is transmitted from the command/data processor 310 to the ECC encoder 321, the ECC encoder 321 may perform an ECC encoding operation on the write data WRITE_DATA to generate a codeword CODEWORD_W. In an embodiment, the codeword CODEWORD_W generated by an ECC encoding operation of the ECC encoder 321 may include write data WRITE_DATA and parity data for correcting errors of the write data WRITE_DATA. The codeword CODEWORD_W generated by the ECC encoder 321 may be transmitted to the memory device 200.

The ECC decoder 322 may receive a codeword CODEWORD_R which is read out of the memory device 200 if the read command READ is outputted from the host 10. The ECC decoder 322 may perform an ECC decoding operation on the codeword CODEWORD_R to correct an error in the codeword CODEWORD_R and to output the corrected codeword CODEWORD_R without parity data as the read data READ_DATA. The read data READ_DATA generated by the ECC decoder 322 may be applied to the command/data processor 310. In an embodiment, the ECC decoding operation may be performed by a syndrome operation, an error location polynomial operation, an error location operation, or an error correction operation. In the syndrome operation, some syndromes necessary for an error location polynomial operation may be calculated using the codeword CODEWORD_R outputted from the memory device 200. In the error location polynomial operation, coefficients of an error location polynomial to which a specific algorithm, for example, a Berlekamp-Massey (BM) algorithm is applied may be calculated using syndromes. In the error location operation, an error location may be calculated using coefficients of an error location polynomial. In the error correction operation, an erroneous bit included in the codeword CODEWORD_R may be corrected by inverting a datum (binary datum) of the erroneous bit which is positioned at the calculated error location.

The ECC decoder 322 may generate an error signal ERROR_SIGNAL having a logic "high" level or a logic "low" level according to the number of erroneous bits included in the codeword CODEWORD_R. If the number of erroneous bits included in the codeword CODEWORD_R is greater than a predetermined value, the ECC decoder 322 may generate the error signal ERROR_SIGNAL having a logic "high" level because a possibility that a memory die storing the codeword CODEWORD_R malfunctions is high. In contrast, if the number of erroneous bits included in the codeword CODEWORD_R less than or equal to the predetermined value, the ECC decoder 322 may generate the error signal ERROR_SIGNAL having a logic "low" level because the possibility that the memory die storing the codeword CODEWORD_R malfunctions is low. The possibility that the memory die malfunctions may be determined by one of various criterions. In an embodiment, the possibility that the memory die malfunctions may be determined by a comparison of the number of erroneous bits included in the codeword CODEWORD_R and an error correction capability of the ECC decoder 322. The error correction capability of the ECC decoder 322 means the maximum number of erroneous bits which are able to be corrected by the ECC decoder 322. The error correction capability of the ECC decoder 322 may be determined by design of the ECC decoder 322. Accordingly, if the number of erroneous bits included in the codeword CODEWORD_R is greater than the error correction capability of the ECC decoder 322, the ECC decoder 322 may generate the error signal ERROR_SIGNAL having a logic "high" level. The error signal ERROR_SIGNAL generated by the ECC decoder 322 may be inputted to the counter 330.

The counter 330 may output a count signal COUNT_VALUE in response to receiving the error signal ERROR_SIGNAL. Specifically, the counter 330 may increase a value of the count signal COUNT_VALUE if the error signal ERROR_SIGNAL having a logic "high" level is inputted to the counter 330. The counter 330 does not increase a value of the count signal COUNT_VALUE if the error signal ERROR_SIGNAL having a logic "low" level is inputted to the counter 330. The counter 330 may include a plurality of sub-counters, for example, first to $N^{th}$ sub-counters that respectively correspond to the first to $N^{th}$ memory dies 210-1, 210-2, . . . and 210-N. The first sub-counter may output a count signal COUNT_VALUE that is incremented or counted up if an error signal ERROR_SIGNAL having a logic "high" level is generated by the ECC decoder 322 during a read operation for reading out data stored in the first memory die 210-1. Similarly, the $N^{th}$ sub-counter may output a count signal COUNT_VALUE that is incremented if an error signal ERROR_SIGNAL having a logic "high" level is generated by the ECC decoder 322 during a read operation for reading out data stored in the $N^{th}$ memory die 210-N.

The count signal COUNT_VALUE outputted from any one of the first to $N^{th}$ sub-counters included in the counter 330 may be inputted to the refresh skip controller 340. In an embodiment, the count signal COUNT_VALUE may include a flag having information concerning which of the first to $N^{th}$ memory dies stores data (i.e., the codeword CODEWORD_R) causing the error signal ERROR_SIGNAL. Accordingly, the refresh skip controller 340 may recognize which of the first to $N^{th}$ memory dies relates to the count signal COUNT_VALUE, using the flag included in the count signal COUNT_VALUE. The counter 330 may reset the count signal COUNT_VALUE if a reset signal RESET generated by the refresh skip controller 340 is inputted to the counter 330. The reset operation of the counter 330 may be performed in relation to each of the sub-counters.

The refresh skip controller 340 may transmit the refresh command REFRESH generated by the host 10 to the memory device 200. The refresh command REFRESH may be generated having a certain cycle time in synchronization with a system clock signal or an internal clock signal. The refresh skip controller 340 may receive the count signal COUNT_VALUE from the counter 330 to generate a refresh skip period signal REFRESH_SKIP_PERIOD and may transmit the refresh skip period signal REFRESH_SKIP_PERIOD to the memory device 200, under a certain condition. Specifically, if a value of the count signal COUNT_VALUE is greater than a critical value, the refresh skip controller 340 may generate the refresh skip period signal REFRESH_SKIP_PERIOD for reducing a refresh skip period (i.e., a refresh skip cycle time). In other words, the refresh skip controller 340 may reset the count signal COUNT_VALUE after transmitting the refresh skip period signal REFRESH_SKIP_PERIOD to the memory die 2210-1, 210-2, . . . or 210-N. In such a case, the reset signal RESET may be applied to the counter 330 to reset the count signal COUNT_VALUE. If a value of the count signal COUNT_VALUE is less than or equal to the critical value, the refresh skip controller 340 may inactivate the refresh skip period signal REFRESH_SKIP_PERIOD. In another embodiment, if a value of the count signal COUNT_VALUE is less than or equal to the critical value, the refresh skip controller 340 may generate the refresh skip period signal REFRESH_SKIP_PERIOD for maintaining the current refresh skip period.

Figure 2:
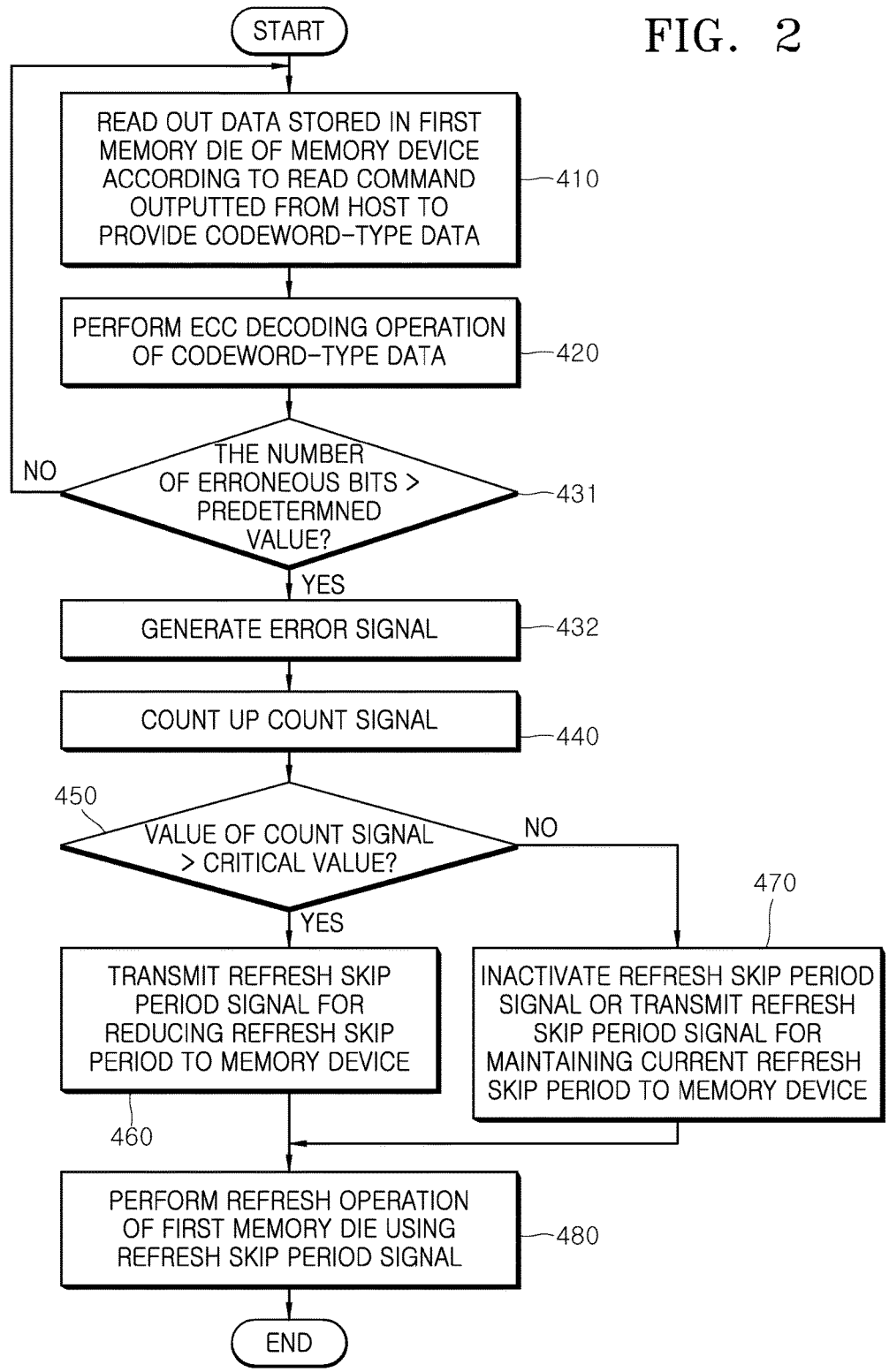
FIG. 2 is a flowchart illustrating a method of controlling a refresh operation of a memory system according to an embodiment of the present disclosure.

FIG. 2 is a flowchart illustrating a method of controlling a refresh operation of a memory system according to an embodiment of the present disclosure. Although the present embodiment illustrated in FIG. 2 describes a method of controlling a refresh skip period of the first memory die 210-1 among the first to $N^{th}$ memory dies 210-1, 210-2, . . . and 210-N included in the memory device 200, the same method as illustrated in FIG. 2 may also be equally applicable to each of the second to $N^{th}$ memory dies 210-2, . . . and 210-N. Referring to FIGS. 1 and 2, the data stored in the first memory die 210-1 may be read out according to the read command READ outputted from the host 10 to provide the codeword CODEWORD_R (see step 410). Specifically, the read command READ outputted from the host 10 may be transmitted to the command/data processor 310 of the memory controller 300. The command/data processor 310 may transmit the read command READ to the memory device 200. The memory device 200 may transmit the codeword CODEWORD_R of data stored in a specific first memory die 210-1 to the ECC controller 320 of the memory controller 300, where the first memory die 210-1 may be assigned by an address accompanied with the read command READ. As described with reference to FIG. 1, the codeword CODEWORD_R may include original data and a parity bit.

Next, an ECC decoding operation on the codeword CODEWORD_R may be performed (see step 420). Subsequently, the error signal ERROR_SIGNAL may be generated according to a result of the ECC decoding operation (see steps 431 and 432). Specifically, the codeword CODEWORD_R may be inputted to the ECC decoder 322 of the ECC controller 320. The ECC decoder 322 may perform an ECC decoding operation for decoding the codeword CODEWORD_R. Erroneous bits in the codeword CODEWORD_R may be corrected by the ECC decoding operation, and the ECC decoder 322 may provide the corrected codeword CODEWORD_R without the parity bit as the read data READ_DATA. In addition, the ECC decoder 322 may generate the error signal ERROR_SIGNAL having a logic "high" level or a logic "low" level according to an error state of the codeword CODEWORD_R which is recognized during the ECC decoding operation for decoding the codeword CODEWORD_R.

The ECC decoder 322 may determine an error state of the codeword CODEWORD_R to generate the error signal ERROR_SIGNAL. In an embodiment, the error state of the codeword CODEWORD_R may be determined based on the number of erroneous bits in the codeword CODEWORD_R. That is, the number of erroneous bits in the codeword CODEWORD_R may be compared with the error correction capability of the ECC decoder 322 to determine the error state of the codeword CODEWORD_R (see step 431). For example, if the number of erroneous bits in the codeword CODEWORD_R is greater than the error correction capability of the ECC decoder 322, the first memory die 210-1 storing the codeword CODEWORD_R may be regarded as a memory die having a poor refresh characteristic. In such a case, the ECC decoder 322 may generate an error signal ERROR_SIGNAL having a logic "high" level (see step 432). In contrast, if the number of erroneous bits in the codeword CODEWORD_R is less than or equal to the error correction capability of the ECC decoder 322, the ECC decoder 322 may generate an error signal ERROR_SIGNAL having a logic "low" level and the steps 410, 420 and 431 may be sequentially performed again according to the read command READ outputted from the host 10. The error signal ERROR_SIGNAL generated by the ECC decoder 322 may be inputted to the counter 330.

If the error signal ERROR_SIGNAL is generated having a logic "high" level (i.e., activated) at step 432, the counter 330 may output the count signal COUNT_VALUE that is incremented (see step 440). In contrast, if the error signal ERROR_SIGNAL is generated having a logic "low" level at the step 432, the counter 330 does not count the count signal COUNT_VALUE. Specifically, if an error signal ERROR_SIGNAL having a logic "high" level is inputted to the counter 330, the first sub-counter of the counter 330 corresponding to the first memory die 210-1 may increase a value of the count signal COUNT_VALUE. The count signal COUNT_VALUE may be inputted to the refresh skip controller 340.

After the refresh skip controller 340 counts the count signal COUNT_VALUE, the value of the count signal COUNT_VALUE may be compared with the critical value (see step 450). If the value of the count signal COUNT_VALUE is greater than the critical value, the refresh skip controller 340 may transmit the refresh skip period signal REFRESH_SKIP_PERIOD for reducing a refresh skip period to the memory device 200 (see step 460). In contrast, if the value of the count signal COUNT_VALUE is equal to or less than the critical value, the refresh skip controller 340 may inactivate the refresh skip period signal REFRESH_SKIP_PERIOD or the refresh skip controller 340 may transmit the refresh skip period signal REFRESH_SKIP_PERIOD for maintaining a current refresh skip period to the memory device 200 (see step 470).

The memory device 200 may perform a refresh operation on the first memory die 210-1 using the refresh skip period signal REFRESH_SKIP_PERIOD (see step 480). For example, if refresh skip controller 340 transmits the refresh skip period signal REFRESH_SKIP_PERIOD for reducing a refresh skip period to the memory device 200 at step 460, the memory device 200 may perform a refresh operation on the first memory die 210-1 using a reduced refresh skip period. In contrast, if the refresh skip period signal REFRESH_SKIP_PERIOD is inactivated or the refresh skip period signal REFRESH_SKIP_PERIOD for reducing a refresh skip period is transmitted to the memory device 200 at step 470, the memory device 200 may perform a refresh operation on the first memory die 210-1 using the current refresh skip period.

Although the method of changing or maintaining a refresh skip period of the first memory die 210-1 is described with reference to FIG. 2, the same method as illustrated in FIG. 2 may also be equally applicable to each of the second to $N^{th}$ memory dies 210-2, . . . and 210-N. Accordingly, even though all of the first to $N^{th}$ memory dies 210-1, 210-2, . . . and 210-N may perform the same refresh operation, at least one of the first to $N^{th}$ memory dies 210-1, 210-2, . . . and 210-N may have a refresh skip period which is different from a refresh skip period of the remaining memory dies. In other words, the memory controller 300 may transmit a refresh skip period signal of each of the memory dies 210-1, 210-2, . . . and 210-N to the refresh skip control block 222 based on a result of an ECC decoding operation performed on each of the memory dies 210-1, 210-2, . . . and 210-N so that the memory dies 210-1, 210-2, . . . and 210-N may have independent refresh skip periods. That is, each of the memory dies may have a different refresh skip period.

Figure 3:
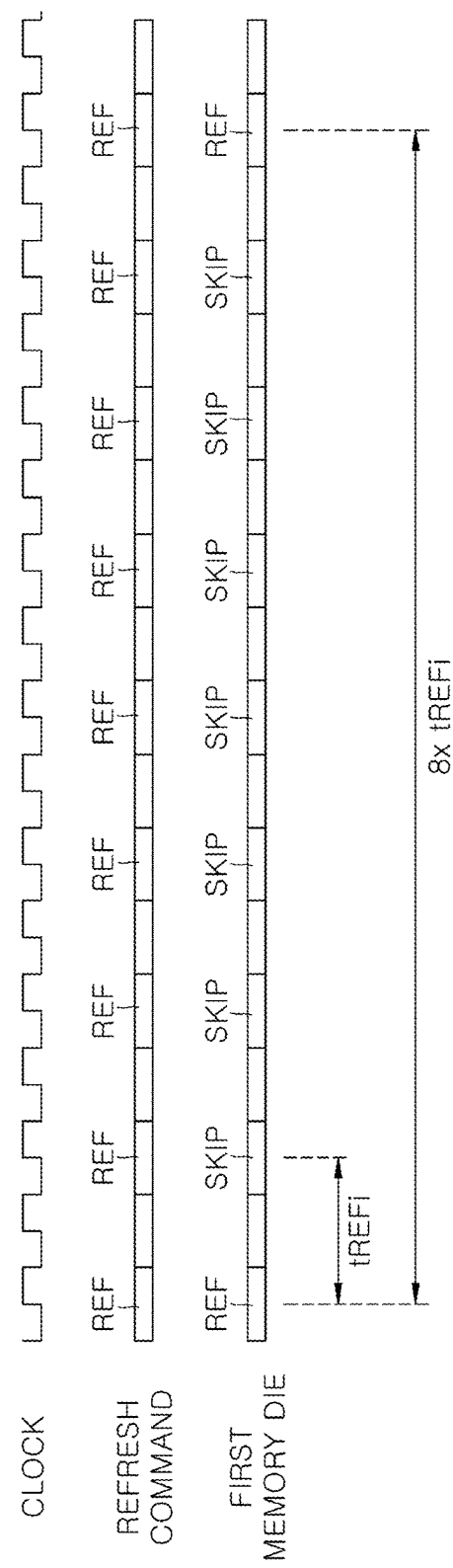
FIGS. 3 and 4 are timing diagrams illustrating refresh skip operations performed in different memory dies included in a memory system according to an embodiment of the present disclosure.
Figure 4:
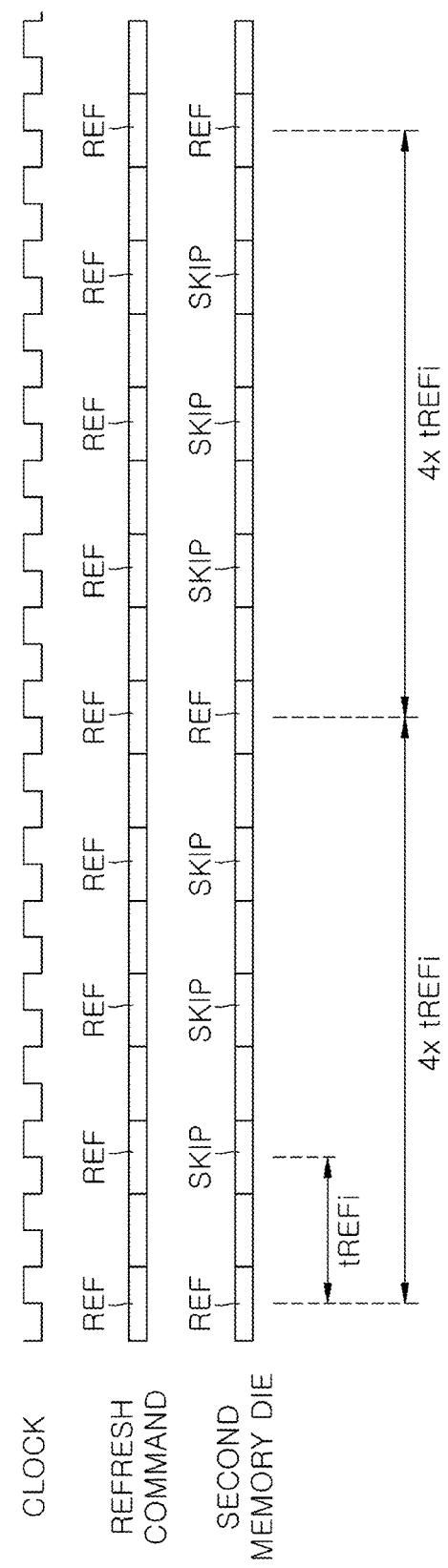

FIGS. 3 and 4 are timing diagrams illustrating refresh skip operations performed in different memory dies included in a memory system according to an embodiment of the present disclosure. Referring to FIG. 3, the refresh controller 220 of the memory device 200 may perform a refresh operation on any one (e.g., the first memory die 210-1) among the first to $N^{th}$ memory dies 210-1, 210-2, . . . and 210-N in response to the refresh command REFRESH which is outputted from the refresh skip controller 340 in synchronization with a clock signal. While the refresh operation performed on the first memory die 210-1 is performed, the refresh skip control block 222 may control the refresh operation performed on the first memory die 210-1 such that the refresh operation performed on the first memory die 210-1 is skipped for a refresh skip period which is set by the refresh skip period signal REFRESH_SKIP_PERIOD outputted from the refresh skip controller 340. In the present embodiment, the refresh skip period of the first memory die 210-1 may be set to be eight times a refresh period tREFi (i.e., a refresh cycle time) of the first to $N^{th}$ memory dies 210-1, 210-2, . . . and 210-N. Thus, the refresh operation may be skipped seven times during a single refresh skip period 8×_tREFi. The refresh skip period 8×_tREFi may be set based on the number of erroneous bits in the codeword CODEWORD_R which is corrected by the ECC encoding operation performed during the read operation on the first memory die 210-1, as described with reference to FIGS. 1 and 2.

Referring to FIG. 4, the refresh controller 220 of the memory device 200 may perform a refresh operation on another memory die (e.g., the second memory die 210-2) among the first to $N^{th}$ memory dies 210-1, 210-2, . . . and 210-N in response to the refresh command REFRESH which is outputted from the refresh skip controller 340 in synchronization with a clock signal. While the refresh operation on the second memory die 210-2 is performed, the refresh skip control block 222 may control the refresh operation performed on the second memory die 210-2 such that the refresh operation of the second memory die 210-2 is skipped for a refresh skip period which is set by the refresh skip period signal REFRESH_SKIP_PERIOD outputted from the refresh skip controller 340. In the present embodiment, the refresh skip period of the second memory die 210-2 may be set to be four times a refresh period tREFi (i.e., a refresh cycle time) of the first to $N^{th}$ memory dies 210-1, 210-2, . . . and 210-N. Thus, the refresh operation may be skipped three times during a single refresh skip period 4×_tREFi. The refresh skip period 4×_tREFi may be set based on the number of erroneous bits in the codeword CODEWORD_R which are corrected by the ECC encoding operation performed during the read operation on the second memory die 210-2, as described with reference to FIGS. 1 and 2.

As described with reference to FIGS. 3 and 4, the second memory die 210-2 may have the refresh skip period 4×_tREFi which is shorter than the refresh skip period 8×_tREFi of the first memory die 210-1. This is because the number of erroneous bits in the codeword CODEWORD_R which are corrected by the ECC encoding operation performed during a read operation performed on the second memory die 210-2 is greater than the number of erroneous bits in the codeword CODEWORD_R which are corrected by an ECC encoding operation performed during the read operation performed on the first memory die 210-1 so that the refresh skip period signal REFRESH_SKIP_PERIOD for reducing the refresh skip period of the second memory die 210-2 to four times the refresh period tREFi is generated by the memory controller 300. Thus, according to the present embodiment, the first to $N^{th}$ memory dies 210-1, 210-2, . . . and 210-N may operate with different refresh skip periods according to the number of erroneous bits in the codewords CODEWORD_R outputted from the first to $N^{th}$ memory dies 210-1, 210-2, . . . and 210-N.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A memory system comprising:
   a memory device configured to include a plurality of memory dies and a refresh controller, wherein the refresh controller includes a refresh skip control block; and
   a memory controller configured to transmit a refresh skip period signal of each of the memory dies to the refresh skip control block according to a result of an error correction code (ECC) decoding operation performed on each of the memory dies so that the memory dies have independent refresh skip periods.

2. The memory system of claim 1,
   wherein the refresh controller controls a refresh operation performed on each of the memory dies; and wherein the refresh controller controls the memory dies so that a refresh skip operation performed on each of the memory dies is performed over the refresh skip period corresponding to the refresh skip period signal transmitted to the refresh skip control block.

3. The memory system of claim 1, wherein the memory controller includes:
   an ECC decoder configured to perform an ECC decoding operation on a read codeword outputted from each of the memory dies to output read data corresponding to the ECC decoded read codeword with an error signal;
   a counter configured to receive the error signal to output a count signal; and
   a refresh skip controller configured to receive the count signal and configured to transmit the refresh skip period signal to the memory die storing the read codeword to change the refresh skip period of the memory die if a value of the count signal is greater than a critical value.

4. The memory system of claim 3, wherein the ECC decoder outputs the error signal which is activated if the number of erroneous bits in the read codeword outputted from the memory die is greater than an error correction capability of the ECC decoder.

5. The memory system of claim 3, wherein the refresh skip controller resets the count signal after transmitting the refresh skip period signal to the memory die.

6. The memory system of claim 3, wherein the refresh skip controller generates the refresh skip period signal for reducing the refresh skip period of the memory die.

7. The memory system of claim 3, wherein the memory controller further includes a command/data processor which is configured to receive a read command from a host to transmit the read command to the memory device and configured to transmit the read data outputted from the ECC decoder to the host.

8. The memory system of claim 7,
   wherein the memory controller further includes an ECC encoder which is configured to perform an ECC encoding operation on write data in response to a write command outputted from the host to generate a write codeword; and
   wherein the command/data processor transmits the write data to the ECC encoder in response to the write command.

9. The memory system of claim 3, wherein the refresh skip controller transmits a refresh command to the refresh controller of the memory device if the refresh command is outputted from a host.

10. A method of refreshing a memory system including a memory device, wherein the memory device includes a plurality of memory dies and a refresh controller and wherein the refresh controller includes a refresh skip control block, the method comprising:
    reading a read codeword stored in any one memory die selected from the memory dies of the memory device according to a read command;
    performing an error correction code (ECC) decoding operation on the read codeword;
    generating read data corresponding to the read codeword decoded by the ECC decoding operation and an error signal;
    generating a count signal in response to the error signal;
    transmitting a refresh skip period signal to the memory device if a value of the count signal is greater than a critical value; and
    changing a refresh skip period of the selected memory die according to the refresh skip period signal.

11. The method of claim 10,
    wherein the memory device refreshes the selected memory die according to a refresh command inputted to the refresh controller; and
    wherein the selected memory die is refreshed on the changed refresh skip period which is set by the refresh skip control block.

12. The method of claim 10 further comprising performing an ECC encoding operation on write data in response to a write command to generate a write codeword before reading the read codeword stored in the selected memory die,
    wherein the write codeword is generated to include parity data for error correction.

13. The method of claim 10, wherein generating the read data and the error signal is performed so that the error signal is activated if the number of erroneous bits in the read codeword is greater than an error correction capability of an ECC decoder.

14. The method of claim 13,
    wherein the count signal is incremented whenever the error signal is activated; and
    wherein the refresh skip period signal of the selected memory die is generated if a value of the count signal is greater than the critical value.

15. The method of claim 14, wherein the refresh skip period signal of the selected memory die is generated to reduce the refresh skip period of the selected memory die if a value of the count signal is greater than the critical value.

16. The method of claim 14 further comprising resetting the count signal if the refresh skip period signal of the selected memory die is generated.

17. The method of claim 13, wherein the ECC decoding operation corrects erroneous bits in the read codeword.

18. The method of claim 17, wherein the ECC decoder provides a corrected read codeword without a parity bit as the read data.

* * * * *